(12) United States Patent
Takahashi et al.

(10) Patent No.: US 10,568,201 B2
(45) Date of Patent: Feb. 18, 2020

(54) MULTILAYER PRINTED WIRING BOARD AND MULTILAYER METAL CLAD LAMINATED BOARD

(71) Applicants: PANASONIC INTELLECTUAL PROPERTY MANAGEMENT CO., LTD., Osaka (JP); TOMOEGAWA CO., LTD., Tokyo (JP)

(72) Inventors: Hiroaki Takahashi, Mie (JP); Tomoyuki Aoki, Osaka (JP); Kiyotaka Komori, Mie (JP); Jun Tochihira, Shizuoka (JP); Ryu Harada, Shizuoka (JP)

(73) Assignees: PANASONIC INTELLECTUAL PROPERTY MANAGEMENT CO., LTD., Osaka (JP); TOMOEGAWA CO., LTD., Tokyo (JP)

( * ) Notice: Subject to any disclaimer, the term of this patent is extended or adjusted under 35 U.S.C. 154(b) by 0 days.

(21) Appl. No.: 16/072,680

(22) PCT Filed: Jan. 24, 2017

(86) PCT No.: PCT/JP2017/002295
§ 371 (c)(1),
(2) Date: Jul. 25, 2018

(87) PCT Pub. No.: WO2017/130945
PCT Pub. Date: Aug. 3, 2017

(65) Prior Publication Data
US 2018/0376579 A1 Dec. 27, 2018

(30) Foreign Application Priority Data
Jan. 26, 2016 (JP) .................. 2016-012062

(51) Int. Cl.
*H05K 1/02* (2006.01)
*H05K 1/09* (2006.01)
(Continued)

(52) U.S. Cl.
CPC ............. *H05K 1/024* (2013.01); *H01B 1/026* (2013.01); *H01B 3/308* (2013.01); *H01B 3/42* (2013.01);
(Continued)

(58) Field of Classification Search
CPC ........ H05K 1/024; H05K 1/09; H05K 1/0243; H05K 1/0298; H05K 3/46; H05K 1/03;
(Continued)

(56) References Cited

U.S. PATENT DOCUMENTS 7,514,637 B1 * 4/2009 En ............................ C25D 3/38
174/256
2003/0178229 A1 * 9/2003 Toyoda ................. H01L 21/486
174/261
(Continued)

FOREIGN PATENT DOCUMENTS

JP 2006-516297 6/2006
JP 2007-515496 6/2007
(Continued)

OTHER PUBLICATIONS

International Search Report issued in International Pat. Appl. No. PCT/JP2017/002295, dated Apr. 11, 2017.
(Continued)

*Primary Examiner* — Ishwarbhai B Patel
(74) *Attorney, Agent, or Firm* — Greenblum & Bernstein, P.L.C.

(57) ABSTRACT

A multilayer printed wiring board has excellent high-frequency characteristics. The multilayer printed wiring board includes one or more conductive layers and one or more
(Continued)

insulating layers. In the multilayer printed wiring board, the one or more conductive layers and the one or more insulating layers are alternately stacked. Each insulating layer of the one or more insulating layers includes one or more of a polyolefin resin layer, a fluororesin layer, a polyphenylene ether resin layer, a polyamideimide resin layer, and a polyimide resin layer. At least one insulating layer of the one or more insulating layers includes a polyolefin resin layer.

6 Claims, 3 Drawing Sheets

(51) Int. Cl.
  H01B 3/30 (2006.01)
  H01B 1/02 (2006.01)
  H01B 3/42 (2006.01)
  H05K 1/03 (2006.01)
(52) U.S. Cl.
  CPC ......... *H05K 1/0243* (2013.01); *H05K 1/0284* (2013.01); *H05K 1/0298* (2013.01); *H05K 1/09* (2013.01); *H05K 1/0353* (2013.01)
(58) Field of Classification Search
  CPC .......... H01B 3/308; H01B 3/42; H01B 1/026; B32B 15/08
  See application file for complete search history.

(56) References Cited

U.S. PATENT DOCUMENTS

| | | | |
|---|---|---|---|
| 2004/0146692 | A1 | 7/2004 | Inoue et al. |
| 2004/0231151 | A1* | 11/2004 | Nakatani ................ H05K 1/113 29/830 |
| 2006/0088715 | A1* | 4/2006 | Husemann ................ C09J 7/10 428/413 |
| 2006/0102384 | A1* | 5/2006 | Watanabe ......... H01L 23/49816 174/256 |
| 2007/0281142 | A1 | 12/2007 | Ohta et al. |
| 2011/0247865 | A1* | 10/2011 | Tsurumi ............... H05K 3/4661 174/255 |
| 2015/0014030 | A1* | 1/2015 | Mitamura ............... B32B 15/08 174/257 |

FOREIGN PATENT DOCUMENTS

| | | |
|---|---|---|
| JP | 2007-324236 | 12/2007 |
| JP | 2011-148156 | 8/2011 |

OTHER PUBLICATIONS

International Preliminary Report on Patentability issued in International Pat. Appl. No. PCT/JP2017/002295, dated Jul. 31, 2018.

\* cited by examiner

MULTILAYER PRINTED WIRING BOARD AND MULTILAYER METAL CLAD LAMINATED BOARD

TECHNICAL FIELD

The present invention relates to multilayer printed wiring boards and multilayer metal clad laminated boards. The present invention specifically relates to a multilayer printed wiring board and a multilayer metal clad laminated board which are included in an electronic apparatus configured to process high-speed signals.

BACKGROUND ART

Aiming to realize ubiquitous society, speed of information transmission has been continuously increasing faster and faster. Examples of a currently available printed wiring board configured to process high-speed signals include a fluororesin board, a polyphenylene ether (PPE) resin board, a polyamideimide (PAI) resin board, and a polyimide (PI) resin board. A material for the PPE resin board of these boards is disclosed in, for example, JP 2006-516297 A (Patent Literature 1).

The fluororesin board, the PPE resin board, the PAI resin board, and the PI resin board as mentioned above, which have excellent high-frequency characteristics, are proposed as various board materials for a current cutting-edge printed wiring board for an electronic apparatus configured to process high-speed signals. In addition to these board materials having excellent high-frequency characteristics, an adhesive material such as a bonding sheet or prepreg is adopted to manufacture a multilayer metal clad laminated board. Moreover, a multilayer printed wiring board is manufactured from the multilayer metal clad laminated board as a material.

For the adhesive material as described above, development of a material having improved high-frequency characteristics is, however, retarded. In particular, in a case of prepreg, an insulating layer has a part formed from a resin layer reinforced by glass cloth having a high permittivity, and thus, it is currently difficult to realize design which reduces the relative permittivity of the insulating layer and which is required to improve the high-frequency characteristics. Thus, it is required to improve the high-frequency characteristics after stacking multilayers as in the case of the multilayer printed wiring board and the multilayer metal clad laminated board.

CITATION LIST

Patent Literature

Patent Literature 1: JP 2006-516297 A

SUMMARY OF INVENTION

One of the objectives of the present invention is to provide a multilayer printed wiring board and a multilayer metal clad laminated board which have excellent high-frequency characteristics.

A multilayer printed wiring board of one aspect according to the present invention includes: one or more conductive layers; and one or more insulating layers. The one or more conductive layers and the one or more insulating layers are alternately stacked. Each of the one or more insulating layers includes one or more of a polyolefin resin layer, a fluororesin layer, a polyphenylene ether resin layer, a polyamideimide resin layer, and a polyimide resin layer. At least one of the one or more insulating layers includes a polyolefin resin layer.

DESCRIPTION OF EMBODIMENTS

An embodiment of the present invention will be described below.

<Multilayer Metal Clad Laminated Board>

First, a multilayer metal clad laminated board 20 of the present embodiment will be described. The multilayer metal clad laminated board 20 can be used as a material for a multilayer printed wiring board 10 which will be described later.

Figure 2:
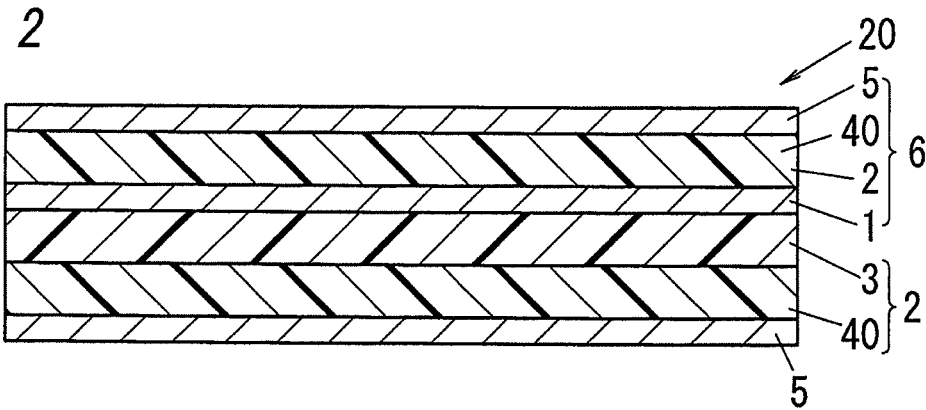
FIG. 2 is a schematic sectional view illustrating a multilayer metal clad laminated board according to the embodiment of the present invention.

FIG. 2 shows an example of the multilayer metal clad laminated board 20. The multilayer metal clad laminated board 20 includes one or more conductive layers 1 and one or more insulating layers 2. The multilayer metal clad laminated board 20 shown in FIG. 2 includes one conductive layer 1 and two insulating layers 2. However, the number of conductive layers 1 and the number of insulating layers 2 are each not particularly limited as long as at least one conductive layer and at least one insulating layer are provided. Although not shown in the figure, the multilayer metal clad laminated board 20 may include, for example, one conductive layer 1 and one insulating layer 2, or two conductive layers 1 and one insulating layer 2.

In this embodiment, the conductive layer 1 actually includes a prescribed conductor pattern configuring various circuits, but in FIG. 2, the conductive layer 1 is shown in a simplified manner.

Moreover, the insulating layer 2 is a layer having an electric insulation property. As described later, the insulating layer 2 may include one kind of resin layer or two or more kinds of resin layers adjacent to each other. Since the insulating layer 2 may thus include two or more kinds of resin layers adjacent to each other, the insulating layer 2 may be referred to as an insulation unit 2.

The multilayer metal clad laminated board 20 further includes a metal layer 5 disposed on at least one of outermost layers of a stack formed by alternately stacking the one or more conductive layers 1 and the one or more insulating layers 2. The outermost layers are layers located at outermost locations. The outermost layers in this embodiment are the insulating layers 2. Note that when the multilayer metal clad laminated board 20 includes only one insulating layer 2, the one insulating layer 2 is the outermost layer. Thus, the one insulating layer 2 has one surface provided with one conductive layer 1 and the other surface provided with one metal layer 5. Alternatively, when the multilayer metal clad laminated board 20 includes one conductive layer and two insulating layers 2 as illustrated in FIG. 2, the two insulating layers 2 are respective outermost layers. In the multilayer metal clad laminated board 20 shown in FIG. 2, one metal layer 5 is provided on each of the two insulating layers 2, that is, the multilayer metal clad laminated board 20 shown in FIG. 2 includes a total of two metal layers 5. However, the multilayer metal clad laminated board 20 may include only one metal layer 5.

In this embodiment, each metal layer 5 is a layer made of, for example, metal overspreading the insulating layer 2.

The multilayer metal clad laminated board 20 shown in FIG. 2 includes at least one conductive layer 1 located therein and the metal layer 5 disposed on at least one of surfaces of the multilayer metal clad laminated board 20. In the multilayer metal clad laminated board 20 shown in FIG. 2, the conductive layer 1 is sandwiched between the insulating layers 2, and the metal layers 5 are further disposed on both the outermost layers, which are the insulating layers 2, in a thickness direction (stacking direction).

The multilayer metal clad laminated board 20 can be manufactured from, for example, a printed wiring board 6, a resin base material, metal foil such as copper foil which will be described later. The one or more insulating layers 2 are made of the resin base material. The one or more metal layers 5 are made from the metal foil. Unnecessary parts of the metal layer 5 are removed to form the conductive layer 1.

Examples of the resin base material include a polyolefin resin sheet and a non-polyolefin resin sheet. Specific examples of the non-polyolefin resin sheet include a fluororesin film, a polyphenylene ether (PPE) resin film, a polyamideimide (PAI) resin film, and a polyimide (PI) resin film. Note that there is no substantial conceptual difference between "sheet" and "film".

The polyolefin resin sheet is a sheet made of a polyolefin resin. The polyolefin resin sheet can form a polyolefin resin layer 3. The polyolefin resin sheet is preferably used as an adhesive sheet. The adhesive sheet is a sheet having adhesion. The polyolefin resin sheet includes glass cloth therein and may be reinforced by the glass cloth.

The non-polyolefin resin sheet is a sheet made of a non-polyolefin resin. The non-polyolefin resin is a resin except for the polyolefin resin. Specific examples of the non-polyolefin resin include a fluororesin, a polyphenylene ether resin, a polyamideimide resin, and a polyimide resin. The non-polyolefin resin sheet can form a non-polyolefin resin layer 40. The non-polyolefin resin layer 40 is a resin layer other than the polyolefin resin layer 3. The non-polyolefin resin layer 40 is one kind of resin layer or two or more kinds of resin layers selected from a group consisting of a fluororesin layer, a polyphenylene ether resin layer, a polyamideimide resin layer, and a polyimide resin layer. The non-polyolefin resin sheet includes glass cloth therein and may be reinforced by the glass cloth.

The fluororesin film is a film made of a fluororesin. The fluororesin film can form the fluororesin layer. Preferably, the fluororesin film includes glass cloth therein and is reinforced by the glass cloth. The fluororesin film reinforced by the glass cloth enables both a reduction in permittivity and dissipation factor and an improvement in dimensional stability. The fluororesin is a synthetic resin obtained by polymerization of olefin containing fluorine. A specific example of the fluororesin is polytetrafluoroethylene.

The polyphenylene ether resin film is a film made of a polyphenylene ether resin. The polyphenylene ether resin film can form the polyphenylene ether resin layer. Preferably, the polyphenylene ether resin film includes glass cloth therein and is reinforced by the glass cloth. The polyphenylene ether resin film reinforced by the glass cloth enables both a reduction in permittivity and dissipation factor and an improvement in dimensional stability. The polyphenylene ether resin is a polymer of 2,6-dimethyl phenylene oxide. The polyphenylene ether resin contains a modified polyphenylene ether resin. The modified polyphenylene ether resin is a polymer alloy of a polyphenylene ether resin and another resin such as a polystyrene resin.

The polyamideimide resin film is a film made of a polyamideimide resin. The polyamideimide resin film can form the polyamideimide resin layer. The polyamideimide resin film includes glass cloth therein and may be reinforced by the glass cloth.

The polyimide resin film is a film made of a polyimide resin. The polyimide resin film can form the polyimide resin layer. The polyimide resin film includes glass cloth therein and may be reinforced by the glass cloth.

In the multilayer metal clad laminated board 20, each insulating layer 2 of the one or more insulating layers 2 includes one or more of the polyolefin resin layer 3, the fluororesin layer, the polyphenylene ether resin layer, the polyamideimide resin layer, and the polyimide resin layer. That is, each insulating layer 2 may include only one layer or may include two or more layers adjacent to each other.

The one insulating layer 2 includes one or more of the polyolefin resin layer 3 and the (four kinds of) non-polyolefin resin layers 40. That is, the one insulating layer 2 includes one or more of five kinds of resin layers (the polyolefin resin layer 3, the fluororesin layer, the polyphenylene ether resin layer, the polyamideimide resin layer, and the polyimide resin layer).

When one kind of resin layer forms one insulating layer 2, the one insulating layer 2 includes one layer.

When two kinds of resin layers form one insulating layer 2, the one insulating layer 2 does not necessarily include two layers but may include three or more layers (e.g., see FIGS. 3C and 3D which will be described later).

Similarly, when three kinds of resin layers form one insulating layer 2, the one insulating layer 2 does not necessarily include three layers but may include four or more layers. Similarly, when four kinds of resin layers form one insulating layer 2, the one insulating layer 2 does not necessarily include four layers but may include five or more layers. Similarly, when five kinds of resin layers form one insulating layer 2, the one insulating layer 2 does not necessarily include five layers but may include six or more layers. That is, when two or more kinds of resin layers form one insulating layer 2, there are both cases where the number of kinds of the resin layers and the number of the resin layers are equal to each other and where the number of kinds of the resin layers and the number of the resin layers are not equal to each other. When two or more kinds of resin layers form one insulating layer 2, the arrangement of the resin layers in the thickness direction (stacking direction) is not particularly limited.

In the multilayer metal clad laminated board 20, at least one insulating layer 2 of the one or more insulating layers 2 includes the polyolefin resin layer 3. That is, when the multilayer metal clad laminated board 20 includes only one insulating layer 2, the one insulating layer 2 includes the polyolefin resin layer 3. When the multilayer metal clad laminated board 20 includes the plurality of insulating layers 2, at least one of the plurality of insulating layers 2 has to include the polyolefin resin layer 3, and all of the plurality of insulating layers 2 may include polyolefin resin layers 3.

The polyolefin resin layer 3 has a good adhesive property with respect to the non-polyolefin resin layer 40. That is, the polyolefin resin layer 3 has a good adhesive property with respect to each of the fluororesin layer, the polyphenylene ether resin layer, the polyamideimide resin layer, and the polyimide resin layer.

FIGS. 3A to 3E show specific examples of specific layer structures of the insulating layer 2.

Figure 3A:
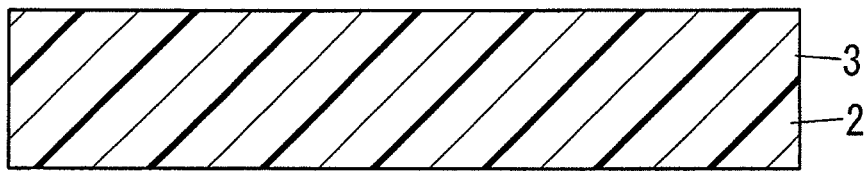
FIGS. 3A to 3E are schematic sectional views illustrating examples of an insulating layer of the multilayer printed wiring board or the multilayer metal clad laminated board.

An insulating layer 2 shown in FIG. 3A includes one kind of resin layer. Specifically, FIG. 3A shows the insulating layer 2 including only a polyolefin resin layer 3. The insulating layer 2 can be formed by heating and curing a polyolefin resin sheet. In this case, one polyolefin resin sheet or a stack of two or more polyolefin resin sheets may be used. Note that the polyolefin resin layer 3 formed by stacking two or more polyolefin resin sheets corresponds to one layer.

Figure 3B:

An insulating layer 2 shown in FIG. 3B also includes one kind of resin layer. Specifically, FIG. 3B shows the insulating layer 2 including only a non-polyolefin resin layer 40. More specifically, FIG. 3B shows the insulating layer 2 including only one of a fluororesin layer, a polyphenylene ether resin layer, a polyamideimide resin layer, and a polyimide resin layer. The insulating layer 2 can be formed only from one of a fluororesin film, a fluororesin film reinforced by glass cloth, a polyphenylene ether resin film, a polyphenylene ether resin film reinforced by glass cloth, a polyamideimide resin film, and a polyimide resin film as a resin base material. In this case, one sheet of the resin base material or a stack of two or more sheets of the resin base material may be used. Note that a resin layer formed by stacking two or more sheets of an identical resin base material corresponds to one layer.

Figure 3C:
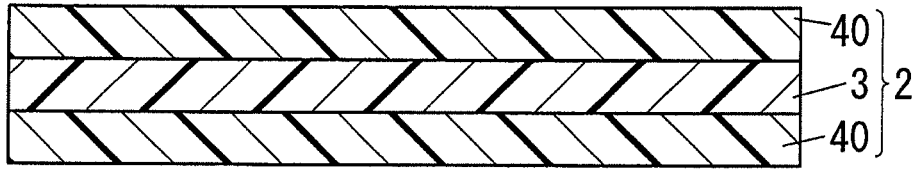

An insulating layer 2 shown in FIG. 3C includes two kinds of resin layers and has a three-layer structure in which a resin layer of one of the two kinds is sandwiched between resin layers of the other of the two kinds. Specifically, FIG. 3C shows the insulating layer 2 formed by stacking non-polyolefin resin layers 40 on both sides of a polyolefin resin layer 3. More specifically, FIG. 3C shows the insulating layer 2 formed by stacking one of a fluororesin layer, a polyphenylene ether resin layer, a polyamideimide resin layer, and a polyimide resin layer on the both sides of the polyolefin resin layer 3. The insulating layer 2 can be formed by heating and curing a composition sheet formed by stacking one of a fluororesin film, a fluororesin film reinforced by glass cloth, a polyphenylene ether resin film, a polyphenylene ether resin film reinforced by glass cloth, a polyamideimide resin film, and a polyimide resin film on both sides of a polyolefin resin sheet.

Figure 3D:
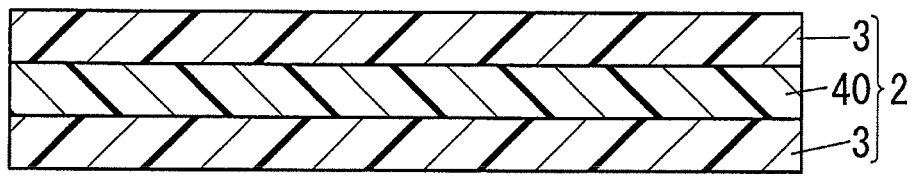

An insulating layer 2 shown in FIG. 3D also includes two kinds of resin layers and has a three-layer structure in which a resin layer of one of the two kinds is sandwiched between resin layers of the other of the two kinds. Specifically, FIG. 3D shows the insulating layer 2 formed by stacking polyolefin resin layers 3 on both sides of a non-polyolefin resin layer 40. More specifically, FIG. 3D shows the insulating layer 2 formed by stacking the polyolefin resin layers 3 on both sides of one of a fluororesin layer, a polyphenylene ether resin layer, a polyamideimide resin layer, and a polyimide resin layer. The insulating layer 2 can be formed by heating and curing a composition sheet formed by stacking polyolefin resin sheets on both sides of one of a fluororesin film, a fluororesin film reinforced by glass cloth, a polyphenylene ether resin film, a polyphenylene ether resin film reinforced by glass cloth, a polyamideimide resin film, and a polyimide resin film.

Figure 3E:
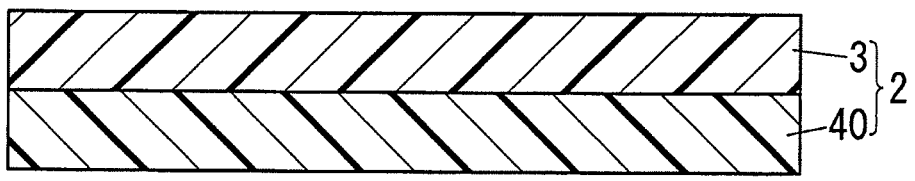

An insulating layer 2 shown in FIG. 3E also includes two kinds of resin layers and has a two-layer structure in which the resin layers are stacked on each other. Specifically, FIG. 3E shows the insulating layer 2 formed by stacking a non-polyolefin resin layer 40 and a polyolefin resin layer 3. More specifically, FIG. 3E shows the insulating layer 2 formed by stacking the polyolefin resin layer 3 and one of a fluororesin layer, a polyphenylene ether resin layer, a polyamideimide resin layer, and a polyimide resin layer. The insulating layer 2 is formed by heating and curing a composition sheet formed by stacking a polyolefin resin sheet and one of a fluororesin film, a fluororesin film reinforced by glass cloth, a polyphenylene ether resin film, a polyphenylene ether resin film reinforced by glass cloth, a polyamideimide resin film, and a polyimide resin film.

In cases of FIGS. 3C to 3E, one polyolefin resin sheet may be used, and a stack of two or more polyolefin resin sheets may be used. Similarly, one fluororesin film may be used, and a stack of two or more fluororesin films may be used. Similarly, one fluororesin film reinforced by glass cloth may be used, and a stack of two or more fluororesin films reinforced by glass cloth may be used. Similarly, one polyphenylene ether resin film may be used, and a stack of two or more polyphenylene ether resin films may be used. Similarly, one polyphenylene ether resin film reinforced by glass cloth may be used, and a stack of two or more polyphenylene ether resin films reinforced by glass cloth may be used. Similarly, one polyamideimide resin film may be used, and a stack of two or more polyamideimide resin films may be used. Similarly, one polyimide resin film may be used, and a stack of two or more polyimide resin films may be used. Note that a resin layer formed by stacking two or more sheets of an identical resin base material corresponds to one layer.

Each of the one or more polyolefin resin layers 3 preferably contains a component (A) representing a polyolefin-based elastomer and a component (B) representing a thermosetting resin, and the component (A) representing the polyolefin-based elastomer preferably has a concentration within a range of 50 wt. % to 95 wt. % in each of the one or more polyolefin resin layers 3. In such a case where each of the one or more polyolefin resin layers 3 contains a large amount of the component (A) representing the polyolefin-based elastomer, the multilayer metal clad laminated board 20 and the multilayer printed wiring board 10 manufactured from the multilayer metal clad laminated board 20 as a material can have increased thermal resistance. This is particularly effective for improving solder thermal resistance after moisture absorption. Moreover, the multilayer metal clad laminated board 20 and the multilayer printed wiring board 10 each have improved flexibility and improved bendability.

The component (A) representing the polyolefin-based elastomer preferably contains one kind or two or more kinds of components selected from a group consisting of polystyrene-poly (ethylene/propylene) block-polystyrene copolymer, polystyrene-poly (ethylene-ethylene/propylene) block-polystyrene copolymer, polystyrene-poly (ethylene/butylene) block-polystyrene copolymer, polystyrene-polyisoprene block copolymer, hydrogenated polystyrene-polyisoprene-polybutadiene block copolymer, polystyrene-poly (butadiene/butylene) block-polystyrene copolymer, ethylene-glycidyl methacrylate copolymer, ethylene-glycidyl methacrylate-methyl acrylate copolymer, and ethylene-glycidyl methacrylate-vinyl acetate copolymer.

The component (B) representing the thermosetting resin preferably contains one kind or two or more kinds of components selected from a group consisting of an epoxy resin, a phenol resin, a bismaleimide resin, and a polyphenylene ether oligomer having vinyl groups at both ends. Examples of the epoxy resin include a dicyclopentadiene epoxy resin.

Each of the one or more polyolefin resin layers 3 may further contain a component (C) representing a curing accelerator. Examples of the curing accelerator include 2-ethyl-4-methylimidazole.

Each of the one or more polyolefin resin layers 3 may further contain a component (D) representing filler. Examples of the filler include silica.

<Manufacturing Method of Multilayer Metal Clad Laminated Board>

The multilayer metal clad laminated board 20 can be manufactured by, for example, the following method.

First, a metal clad laminated board 60 is prepared. The metal clad laminated board 60 has a smaller number of layers than the multilayer metal clad laminated board 20 and serves as a material for the multilayer metal clad laminated board 20.

Figure 4A:
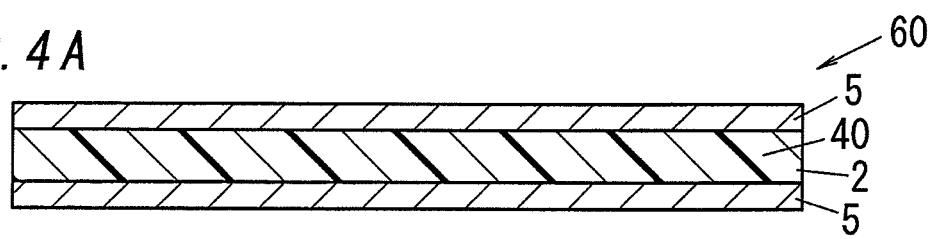
FIG. 4A is a schematic sectional view illustrating an example of a metal clad laminated board which can serve as a material for the multilayer printed wiring board or the multilayer metal clad laminated board.

Specific examples of the metal clad laminated board 60 may include a one-sided metal clad laminated board in which metal foil is attached to one surface of the insulating layer 2 illustrated in any one of FIGS. 3A to 3E and a double-sided metal clad laminated board in which sheets of metal foil are attached to both surfaces of the insulating layer 2 illustrated in any one of FIGS. 3A to 3E. As one of these examples, FIG. 4A illustrates the metal clad laminated board 60 (double-sided metal clad laminated board) in which metal layers 5 are provided to both surfaces of the insulating layer 2 illustrated in FIG. 3B. In this example, the insulating layer 2 includes one kind of resin layer. Specifically, the insulating layer 2 includes the non-polyolefin resin layer 40 (any one of a fluororesin layer, a polyphenylene ether resin layer, a polyamideimide resin layer, and a polyimide resin layer), and the metal layers 5 include sheets of metal foil.

Figure 4B:
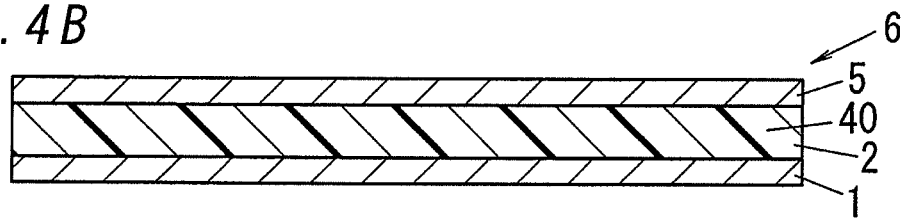
FIG. 4B is a schematic sectional view illustrating an example of a printed wiring board which can serve as a material for the multilayer printed wiring board or the multilayer metal clad laminated board.

The following description relates to an example in which the printed wiring board 6 shown in FIG. 4B is formed from the metal clad laminated board 60 (see FIG. 4A) formed by pasting sheets of metal foil on both surfaces of the non-polyolefin resin layer 40 (any one of the fluororesin layer, the polyphenylene ether resin layer, the polyamideimide resin layer, and the polyimide resin layer), and then, the multilayer metal clad laminated board 20 shown in FIG. 2 is manufactured. However, the present invention is not limited to this example.

Unnecessary parts of one of the metal layers 5 of the metal clad laminated board 60 shown in FIG. 4A are removed to form the conductive layer 1. Accordingly, the metal clad laminated board 60 is turned into the printed wiring board 6 as illustrated in FIG. 4B. More specifically, in FIG. 4B, the unnecessary parts of one of the metal layers 5, corresponding to one of opposite outermost layers, of the metal clad laminated board 60 are removed by, for example, etching, and thereby the conductive layer 1 is formed. The other of the metal layers 5 remains as the other of the opposite outermost layers. Note that the conductive layer 1 actually has a predetermined conductor pattern constituting various circuits, but the conductive layer 1 is illustrated in a simplified manner in FIG. 4B. When the conductive layer 1 includes a circuit for transmitting high-speed signals or a circuit having a long transmission distance, the conductive layer 1 is, as shown in FIG. 4B, preferably formed so as to be in contact with the non-polyolefin resin layer 40 (any one of the fluororesin layer, the polyphenylene ether resin layer, the polyamideimide resin layer, and the polyimide resin layer). This enables a reduction in the transmission loss of high-speed signals of the multilayer printed wiring board 10.

Next, the printed wiring board 6 as shown in FIG. 4B, an adhesive sheet (polyolefin resin sheet), and other resin base materials (a non-polyolefin resin sheet, specifically, any one of a fluororesin film, a polyphenylene ether resin film, a polyamideimide resin film, and a polyimide resin film) are stacked and hot pressed to form the multilayer metal clad laminated board 20 as shown in FIG. 2.

Specifically, the multilayer metal clad laminated board 20 shown in FIG. 2 can be manufactured by stacking a polyolefin resin sheet for forming the polyolefin resin layer 3, a non-polyolefin resin sheet (any one of a fluororesin film for forming a fluororesin layer, a polyphenylene ether resin film for forming the polyphenylene ether resin layer, a polyamideimide resin film for forming the polyamideimide resin layer, and a polyimide resin film for forming the polyimide resin layer) for forming the non-polyolefin resin layer 40, and metal foil for forming the metal layer 5 in this order on the conductive layer 1 of the printed wiring board 6 shown in FIG. 4B, and hot pressing them. One insulating layer 2 includes adjacent two layers which are the polyolefin resin layer 3 and the non-polyolefin resin layer 40 (any one of the fluororesin layer, the polyphenylene ether resin layer, the polyamideimide resin layer, and the polyimide resin layer).

In this embodiment, in the multilayer metal clad laminated board 20 shown in FIG. 2, the number of printed wiring boards 6, the number of polyolefin resin sheets, the number of non-polyolefin resin sheets (fluororesin films, polyphenylene ether resin films, polyamideimide resin films, or polyimide resin films), and the number of sheets of metal foil may be increased so as to further increase the number of layers in the multilayer metal clad laminated board 20. Accordingly, further layering can be carried out.

The multilayer metal clad laminated board 20 illustrated in FIG. 2 has a structure such that the printed wiring board 6 is disposed at an outer side of the multilayer metal clad laminated board 20. In this case, the conductive layer 1 serves as one of outermost layers of the printed wiring board 6 in use, and the metal layer 5 serves as the other of the outermost layers of the printed wiring board 6 (see FIG. 4B). The conductive layer 1 has a predetermined conductor pattern constituting various circuits. The metal layer 5 is a layer made of, for example, metal overspreading the insulating layer 2. During the manufacturing of the multilayer metal clad laminated board 20, the printed wiring board 6 is arranged such that the conductive layer 1 is placed at an inner part of the multilayer metal clad laminated board 20 and the metal layer 5 is placed at the outer side of the multilayer metal clad laminated board 20.

On the other hand, the multilayer metal clad laminated board 20 may have a structure such that the entire printed wiring board 6 is disposed at the inner part of the multilayer metal clad laminated board 20, which is not illustrated in figures. In this case, the printed wiring board 6 in use has two conductive layers 1 serving as both of the outermost layers of the printed wiring board 6, which is not illustrated in figures. Both of these conductive layers 1 are included inside the multilayer metal clad laminated board 20.

In the multilayer metal clad laminated board 20, each insulating layer 2 of the one or more insulating layers 2 includes one or more of the polyolefin resin layer 3, the fluororesin layer, the polyphenylene ether resin layer, the polyamideimide resin layer, and the polyimide resin layer, and at least one insulating layer 2 of the one or more insulating layers 2 includes the polyolefin resin layer 3. The five kinds of resin layers, which are the polyolefin resin layer 3, the fluororesin layer, the polyphenylene ether resin layer, the polyamideimide resin layer, and the polyimide resin layer, all have excellent high-frequency characteristics, and the polyolefin resin layer 3 also has a good adhesive property with respect to the other four kinds of resin layers (non-polyolefin resin layers 40). This enables a reduction in the transmission loss of high-speed signals of the multilayer printed wiring board 10 obtained by processing the multilayer metal clad laminated board 20.

In a specific example, the multilayer metal clad laminated board 20 shown in FIG. 2 includes two insulating layers 2.

A first one of the insulating layers 2 includes one kind of resin layer. Specifically, the first one of the insulating layers 2 includes only the non-polyolefin resin layer 40. More specifically the first one of the insulating layers 2 includes one of the fluororesin layer, the polyphenylene ether resin layer, the polyamideimide resin layer, and the polyimide resin layer.

A second one of the insulating layers 2 includes two kinds of resin layers. Specifically, the second one of the insulating layers 2 includes two layers, that is, the polyolefin resin layer 3 and the non-polyolefin resin layer 40. More specifically, the second one of the insulating layers 2 includes two layers, that is, the polyolefin resin layer 3 and one of the fluororesin layer, the polyphenylene ether resin layer, the polyamideimide resin layer, and the polyimide resin layer.

The specifications of the printed wiring board 6, the polyolefin resin sheet, and the non-polyolefin resin sheet (the fluororesin film, the polyphenylene ether resin film, the polyamideimide resin film, or the polyimide resin film) in use are predetermined to satisfy the above-described conditions, and the thicknesses and the numbers of the printed wiring board 6, the polyolefin resin sheet, and the non-polyolefin resin sheet are also adjusted. Also in this case, the conductive layer 1 including a circuit for transmitting high-speed signals and/or a circuit having a long transmission distance is preferably in contact with the non-polyolefin resin layer 40 (any one of the fluororesin layer, the polyphenylene ether resin layer, the polyamideimide resin layer, and the polyimide resin layer). This enables a reduction in the transmission loss of high-speed signals of the multilayer printed wiring board 10 obtained by processing the multilayer metal clad laminated board 20.

Note that layering can be performed once, twice, or more times. In addition, the number of layers is not particularly limited but can be determined depending on the design of the desired multilayer metal clad laminated board 20.

<Multilayer Printed Wiring Board>

Next, the multilayer printed wiring board 10 of the present embodiment will be described. The multilayer printed wiring board 10 may be produced by, for example, removing unnecessary parts of one or both of the metal layers 5 serving as the outermost layers of the multilayer metal clad laminated board 20 by, for example, etching to form the conductive layer 1.

Figure 1A:
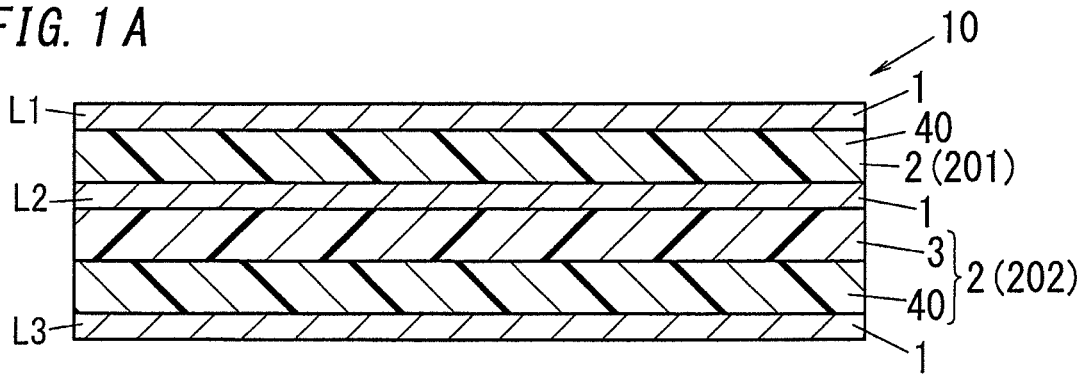
FIGS. 1A to 1C are schematic sectional views illustrating multilayer printed wiring boards according to an embodiment of the present invention.

FIG. 1A shows an example of the multilayer printed wiring board 10 of the present embodiment. The multilayer printed wiring board 10 includes one or more conductive layers 1 and one or more insulating layers 2. The multilayer printed wiring board 10 shown in FIG. 1A includes three conductive layers 1 and two insulating layers 2, but each of the number of conductive layers 1 and the number of insulating layers 2 is not particularly limited as long as one or more conductive layers and one or more insulating layers are provided.

In the multilayer printed wiring board 10, the one or more conductive layers 1 and the one or more insulating layers 2 are alternately stacked. In the multilayer printed wiring board 10 shown in FIG. 1A, three conductive layers 1 and two insulating layers 2 are alternately stacked, and the conductive layers 1 are disposed to serve as respective outermost layers in the thickness direction (stacking direction) of the multilayer printed wiring board 10. Each conductive layer 1 includes, for example, a signal layer, a power supply layer, and a ground layer. Note that in the multilayer printed wiring board 10, each conductive layer 1 actually has a prescribed conductor pattern constituting various circuits, but in FIG. 1A, each conductive layer 1 is shown in a simplified manner. In FIG. 1A, via hole (e.g., through hole plating) for electrically connecting different conductive layers 1 are omitted.

In the multilayer printed wiring board 10, each insulating layer 2 of the one or more insulating layers 2 includes one or more of the polyolefin resin layer 3, a fluororesin layer, a polyphenylene ether resin layer, a polyamideimide resin layer, and a polyimide resin layer, and at least one of the one or more insulating layers 2 includes the polyolefin resin layer 3. As a specific example, the multilayer printed wiring board 10 shown in FIG. 1A includes two insulating layers 2.

A first one of the insulating layers 2 includes one kind of resin layer. Specifically, the first one of the insulating layers 2 includes only the non-polyolefin resin layer 40. More specifically, the first one of the insulating layers 2 includes one of the fluororesin layer, the polyphenylene ether resin layer, the polyamideimide resin layer, and the polyimide resin layer.

A second one of the insulating layers 2 includes two kinds of resin layers. Specifically, the second one of the insulating layers 2 includes two layers, that is, the polyolefin resin layer 3 and the non-polyolefin resin layer 40. More specifically, the second one of the insulating layers 2 includes two layers, that is, the polyolefin resin layer 3 and one of the fluororesin layer, the polyphenylene ether resin layer, the polyamideimide resin layer, and the polyimide resin layer.

The five kinds of resin layers, which are the polyolefin resin layer 3, the fluororesin layer, the polyphenylene ether resin layer, the polyamideimide resin layer, and the polyimide resin layer, all have excellent high-frequency characteristics, and the polyolefin resin layer 3 also has a good adhesive property with respect to the other four kinds of resin layers (non-polyolefin resin layers 40). Thus, the multilayer printed wiring board 10 has excellent high-frequency characteristics. This enables a reduction in the transmission loss of high-speed signals of the multilayer printed wiring board 10. In particular, the polyolefin resin layer 3 after a process at 180° C. for 60 minutes preferably has a storage elastic modulus within a range of $10^5$ Pa to $10^8$ Pa at a temperature ranging from 25° C. to 150° C. Thus, the thermal shock resistance of the multilayer printed wiring board 10 can be increased, and disconnection of via hole plating and/or through hole plating in the multilayer printed wiring board 10 can be suppressed, further leading to improved solder thermal resistance during reflow.

In this embodiment, when the multilayer printed wiring board 10 includes two insulating layers 2 as illustrated in FIG. 1A, one insulating layer 2 (first insulating layer 201) of the two insulating layers 2 includes the non-polyolefin resin layer 40, and a remaining one insulating layer 2 (second insulating layer 202) of the two insulating layers 2 includes the polyolefin resin layer 3. That is, the first insulating layer 201 includes one or more of a fluororesin layer, a polyphenylene ether resin layer, a polyamideimide resin layer, and a polyimide resin layer, and the second insulating layer 202 includes the polyolefin resin layer 3. In this case, the first insulating layer 201 may further include a polyolefin resin layer 3, and the second insulating layer 202 may further include a non-polyolefin resin layer 40.

As described above, the first insulating layer 201 includes one or more of the fluororesin layer, the polyphenylene ether resin layer, the polyamideimide resin layer, and the polyimide resin layer, and the second insulating layer 202 includes the polyolefin resin layer 3. This enables a reduction in the transmission loss of high-speed signals.

Figure 1B:
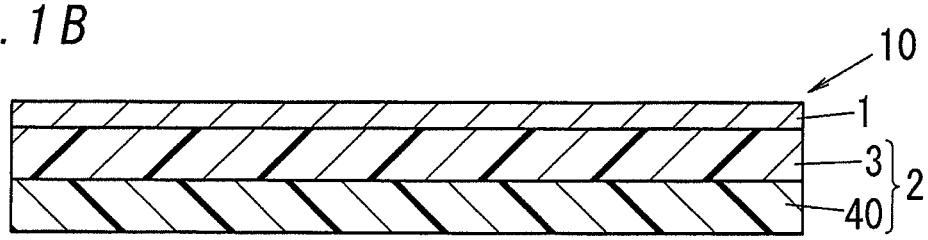

FIG. 1B shows another example of the multilayer printed wiring board 10 of the present embodiment. The multilayer printed wiring board 10 includes one insulating layer 2 serving as the one or more insulating layers 2. The multilayer printed wiring board 10 further includes one conductive layer 1 serving as the one or more conductive layers 1 and being stacked on one surface of the one insulating layer 2.

The one insulating layer 2 includes the non-polyolefin resin layer 40 and the polyolefin resin layer 3. That is, the one insulating layer 2 includes the polyolefin resin layer 3 and one or more of a fluororesin layer, a polyphenylene ether resin layer, a polyamideimide resin layer, and a polyimide resin layer.

As described above, the one insulating layer 2 includes the polyolefin resin layer 3 and one or more of a fluororesin layer, a polyphenylene ether resin layer, a polyamideimide resin layer, and a polyimide resin layer. This enables a reduction in the transmission loss of high-speed signals.

Figure 1C:
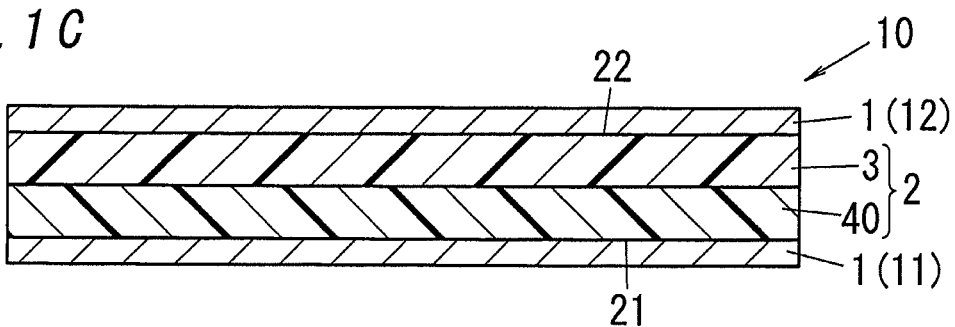

FIG. 1C shows still another example of the multilayer printed wiring board 10 of the present embodiment. In the multilayer printed wiring board 10, one insulating layer 2 serves as the one or more insulating layers 2. Moreover, in the multilayer printed wiring board 10, a first conductive layer 11 and a second conductive layer 12 serve as the one or more conductive layers 1. The first conductive layer 11 is stacked on a first surface 21 of both surfaces of the one insulating layer 2. The second conductive layer 12 is stacked on a second surface 22 of the both surfaces of the one insulating layer 2.

The one insulating layer 2 includes the non-polyolefin resin layer 40 and the polyolefin resin layer 3. That is, the one insulating layer 2 includes the polyolefin resin layer 3 and one or more of a fluororesin layer, a polyphenylene ether resin layer, a polyamideimide resin layer, and a polyimide resin layer.

As described above, the one insulating layer 2 includes the polyolefin resin layer 3 and one or more of a fluororesin layer, a polyphenylene ether resin layer, a polyamideimide resin layer, and a polyimide resin layer. This enables a reduction in the transmission loss of high-speed signals.

As can be seen from the above-described embodiments, the multilayer printed wiring board (10) of a first aspect according to the present invention includes one or more conductive layers (1) and one or more insulating layers (2).

In the multilayer printed wiring board (10), the one or more conductive layers (1) and the one or more insulating layers (2) are alternately stacked.

Each insulating layer (2) of the one or more insulating layers (2) includes one or more of a polyolefin resin layer (3), a fluororesin layer, a polyphenylene ether resin layer, a polyamideimide resin layer, and a polyimide resin layer.

At least one insulating layer (2) of the one or more insulating layers (2) includes the polyolefin resin layer (3).

According to the first aspect, each insulating layer (2) of the one or more insulating layers (2) includes one or more of the polyolefin resin layer (3), the fluororesin layer, the polyphenylene ether resin layer, the polyamideimide resin layer, and the polyimide resin layer, and at least one insulating layer (2) of the one or more insulating layers (2) includes the polyolefin resin layer (3). This enables a reduction in the transmission loss of high-speed signals.

In a multilayer printed wiring board (10) of a second aspect according to the present invention referring to the first aspect, one insulating layer (2) serves as the one or more insulating layers (2), and one conductive layer (1) serves as the one or more conductive layers (1) and is stacked on one surface of the one insulating layer (2).

The one insulating layer (2) includes the polyolefin resin layer (3) and one or more of a fluororesin layer, a polyphenylene ether resin layer, a polyamideimide resin layer, and a polyimide resin layer.

According to the second aspect, the one insulating layer (2) includes the polyolefin resin layer (3) and one or more of the fluororesin layer, the polyphenylene ether resin layer, the polyamideimide resin layer, and the polyimide resin layer. This enables a reduction in the transmission loss of high-speed signals.

In a multilayer printed wiring board (10) of a third aspect according to the present invention referring to the first aspect, one insulating layer (2) serves as the one or more insulating layers (2), and a first conductive layer (11) and a second conductive layer (12) serve as the one or more conductive layers (1). The first conductive layer (11) is stacked on a first surface (21) of both surfaces of the one insulating layer (2). The second conductive layer (12) is stacked on a second surface (22) of the both surfaces of the one insulating layer (2).

The one insulating layer (2) includes the polyolefin resin layer (3) and one or more of a fluororesin layer, a polyphenylene ether resin layer, a polyamideimide resin layer, and a polyimide resin layer.

According to the third aspect, the one insulating layer (2) includes the polyolefin resin layer (3) and one or more of the fluororesin layer, the polyphenylene ether resin layer, the polyamideimide resin layer, and the polyimide resin layer. This enables a reduction in the transmission loss of high-speed signals.

In a multilayer printed wiring board (10) of a fourth aspect according to the present invention referring to the first aspect, two insulating layers (2) serve as the one or more insulating layers (2), and the one or more conductive layers (1) are stacked alternately with the two insulating layers (2).

One insulating layer (2) of the two insulating layers (2) includes one or more of a fluororesin layer, a polyphenylene ether resin layer, a polyamideimide resin layer, and a polyimide resin layer.

A remaining insulating layer (2) of the two insulating layers (2) includes the polyolefin resin layer (3).

According to the fourth aspect, the one insulating layer (2) of the two insulating layers (2) includes one or more of the fluororesin layer, the polyphenylene ether resin layer, the polyamideimide resin layer, and the polyimide resin layer, and the remaining insulating layer (2) of the two insulating layers (2) includes the polyolefin resin layer (3). This enables a reduction in the transmission loss of high-speed signals.

A multilayer printed wiring board (10) of a fifth aspect according to the present invention referring to any one of the first to fourth aspects, the polyolefin resin layer (3) contains a component (A) representing a polyolefin-based elastomer and a component (B) representing a thermosetting resin.

The component (A) representing the polyolefin-based elastomer preferably has a concentration within a range of 50 wt. % to 95 wt. % in an entirety of the polyolefin resin layer (3).

According to the fifth aspect, the polyolefin resin layer (3) contains a large amount of the component (A) representing polyolefin-based elastomer. This improves the thermal resistances of the multilayer metal clad laminated board (20) and the multilayer printed wiring board (10) manufactured from the multilayer metal clad laminated board (20) as a material. In particular, the fifth aspect is effective to increase solder thermal resistance after moisture absorption. Moreover, the flexibility of each of the multilayer metal clad laminated board (20) and the multilayer printed wiring board (10) is increased, which further increases the bendability of each of the multilayer metal clad laminated board (20) and the multilayer printed wiring board (10).

In a multilayer printed wiring board (10) of a sixth aspect according to the present invention referring to the fifth aspect, the component (A) representing the polyolefin-based elastomer contains one kind or two or more kinds of components selected from a group consisting of polystyrene-poly (ethylene/propylene) block-polystyrene copolymer, polystyrene-poly (ethylene-ethylene/propylene) block-polystyrene copolymer, polystyrene-poly (ethylene/butylene) block-polystyrene copolymer, polystyrene-polyisoprene block copolymer, hydrogenated polystyrene-polyisoprene-polybutadiene block copolymer, polystyrene-poly (butadiene/butylene) block-polystyrene copolymer, ethylene-glycidyl methacrylate copolymer, ethylene-glycidyl methacrylate-methyl acrylate copolymer, and ethylene-glycidyl methacrylate-vinyl acetate copolymer.

In a multilayer printed wiring board (10) of a seventh aspect according to the present invention referring to the fifth aspect or the sixth aspect, the component (B) representing the thermosetting resin contains one kind or two or more kinds of components selected from a group consisting of an epoxy resin, a phenol resin, a bismaleimide resin, and a polyphenylene ether oligomer having vinyl groups at both ends.

In a multilayer printed wiring board (10) of an eighth aspect of the present invention referring to any one of the first to seventh aspects, the polyolefin resin layer (3) further contains a component (C) representing a curing accelerator.

In a multilayer printed wiring board (10) of a ninth aspect according to the present invention referring to any one of the first to eighth aspects, the polyolefin resin layer (3) further contains a component (D) representing filler.

In a multilayer printed wiring board (10) of a tenth aspect according to the present invention referring to any one of the first to ninth aspects, the polyolefin resin layer (3) after processed at 180° C. for 60 minutes has a storage elastic modulus within a range of $10^5$ Pa to $10^8$ Pa at temperature range of 25° C. to 150° C.

A multilayer metal clad laminated board (20) of one aspect of the present invention includes one or more conductive layers (1) and one or more insulating layers (2).

In the multilayer metal clad laminated board (20), the one or more conductive layers (1) and the one or more insulating layers (2) are alternately stacked to form a stack, and the multilayer metal clad laminated board (20) includes a metal layer (5) provided on at least one of outermost layers of the stack.

Each insulating layer (2) of the one or more insulating layers (2) includes a polyolefin resin layer (3) and one or more of a fluororesin layer, a polyphenylene ether resin layer, a polyamideimide resin layer, a polyimide resin layer.

At least one insulating layer (2) of the one or more insulating layers (2) includes the polyolefin resin layer (3).

According to the multilayer metal clad laminated board (20) of the one aspect, each insulating layer (2) of the one or more insulating layers (2) includes one or more of polyolefin resin layer (3), the fluororesin layer, the polyphenylene ether resin layer, the polyamideimide resin layer, and the polyimide resin layer, and at least one insulating layer (2) of the one or more insulating layers (2) includes the polyolefin resin layer (3). This enables a reduction in the transmission loss of high-speed signals.

EXAMPLES

The present invention will be specifically described with reference to examples below, but the present invention is not limited to the following examples.

In each of Examples 1 to 5 and Comparative Example 1, a three-layer printed wiring board as illustrated in FIG. 1A was manufactured. For convenience of explanation, three conductive layers 1 (including copper foil before a conductor pattern is formed) are distinguished by naming them L1 to L3 in this order from one of opposite outermost layers. Note that "PCB configuration" in each of Tables 1 to 6 means a layered structure of the three-layer printed wiring board. Also, hereinafter, for example, "L1/L2 copper-clad laminated board (or printed wiring board)" means a copper-clad laminated board (or a printed wiring board) which includes L1 and L2 denoting the conductive layers 1, and "L1 to L3 three-layered printed wiring board" means a three-layer printed wiring board which includes L1 to L3 denoting all three conductive layers 1. Moreover, Table 7 shows a composition table of polyolefin resin compositions for forming polyolefin resin sheets used in Examples 1 to 5. Moreover, Table 8 shows manufacturers, product names, and the like of components included in the polyolefin resin compositions.

Example 1

Example 1 includes eleven examples, i.e., Examples 1-(1) to 1-(11). These examples are the same except for only a polyolefin resin sheet which will be described later.

As an L1/L2 high-frequency substrate prepared was a glass fluororesin copper clad laminated board "R-4737" (copper foil having a thickness 18 μm, a glass cloth reinforced fluororesin having a thickness of 0.16 mm) manufactured by Panasonic Corporation.

As an L3 high-frequency substrate prepared was a one-sided copper clad laminated board obtained by removing copper foil on one surface of the L1/L2 high-frequency substrate (double-sided copper clad laminated board) by etching.

Next, a signal layer was formed on the L2 of the L1/L2 glass fluororesin copper clad laminated board, thereby obtaining an L1 to L2 glass fluororesin printed wiring board.

Moreover, a polyolefin resin sheet having a thickness of 25 μm was formed from each of the resin compositions (1) to (11) shown in Table 7, and the polyolefin resin sheet (one sheet) was disposed between the L1 to L2 glass fluororesin printed wiring board and the L3 one-sided copper clad laminated board. The L1 to L2 glass fluororesin printed wiring board and the L3 one-sided copper clad laminated board with the polyolefin resin sheet disposed therebetween was hot pressed at 180° C. for 60 minutes, thereby manufacturing a three-layer metal clad laminated board.

Then, ground layers were formed on the L1 and L3 of the three-layer metal clad laminated board, thereby manufacturing a three-layer printed wiring board.

Example 2

Example 2 includes eleven examples, i.e., Examples 2-(1) to 2-(11). These examples are the same except for only a polyolefin resin sheet which will be described later.

As an L1/L2 high-frequency substrate prepared was a copper clad laminated board "R-5775K MEGTRON6" (copper foil having a thickness of 18 μm, a glass cloth reinforced PPE resin having a thickness of 0.13 mm) manufactured by Panasonic Corporation.

As an L3 high-frequency substrate prepared was a one-sided copper clad laminated board obtained by removing copper foil on one surface of the L1/L2 high-frequency substrate (double-sided copper clad laminated board) by etching.

A three-layer printed wiring board was manufactured in the same manner as in Example 1 except that the thus prepared L1/L2 high-frequency substrate and L3 high-frequency substrate were used instead of the L1/L2 high-frequency substrate and the L3 high-frequency substrate of Example 1.

Example 3

Example 3 includes eleven examples, i.e., Examples 3-(1) to 3-(11). These examples are the same except for only the polyolefin resin sheet which will be described later.

An L1/L2 high-frequency substrate was prepared by being manufactured as indicated below. First, a PAI resin which will be described later was applied to have a thickness of 5 μm on copper foil having a thickness of 12 μm and was dried, thereby forming a substrate. One more substrate which has the same structure as the structure of this substrate was formed. Then, these two substrates were stacked with their PAI resins facing each other and were hot pressed to be bonded to each other, thereby manufacturing a double-sided copper clad laminated board (copper foil having a thickness of 12 μm, PAI resin having a thickness of 10 μm). The double-sided copper clad laminated board was prepared as the L1/L2 high-frequency substrate.

The PAI resin was prepared as described below. A mixture was obtained by blending 192 g of trimellitic acid anhydride (manufactured by Nacalai Tesque, Inc.), 211 g of 4,4'-diisocyanate-3,3'-dimethyl biphenyl, 35 g of 2,4-diisocyanatotoluene, 1 g of diazabicycloundecene (San-Apro Ltd.), and 2482 g of N,N-dimethyl acetamide (DMAC, manufactured by Nacalai Tesque, Inc.) so as to realize a polymer concentration of 15 wt. %, and the thus obtained mixture was heated to 100° C. in 1 hour and was subsequently maintained at 100° C. for six hours to promote reaction. Then, 1460 g of DMAC were further added to the mixture to adjust the polymer concentration to 10 wt. %, and the mixture was subsequently cooled to a room temperature. Thus, a resin solution containing polyamideimide dissolved therein was obtained. The resin solution is used as the PAI resin during manufacturing of the L1/L2 high-frequency substrate.

As an L3 high-frequency substrate prepared was a one-sided copper clad laminated board obtained by removing copper foil on one surface of the L1/L2 high-frequency substrate (double-sided copper clad laminated board) by etching.

A three-layer printed wiring board was manufactured in the same manner as in Example 1 except that the thus prepared L1/L2 high-frequency substrate and L3 high-frequency substrate were used instead of the L1/L2 high-frequency substrate and the L3 high-frequency substrate of Example 1.

Example 4

Example 4 includes eleven examples, i.e., Examples 4-(1) to 4-(11). These examples are the same except for only a polyolefin resin sheet which will be described later.

As an L1/L2 high-frequency substrate prepared was a copper clad laminated board "R-F775 23EJ-M" (copper foil having a thickness of 12 μm, a PI resin having a thickness of 0.05 mm) manufactured by Panasonic Corporation.

As an L3 high-frequency substrate prepared was a one-sided copper clad laminated board obtained by removing copper foil on one surface of the L1/L2 high-frequency substrate (double-sided copper clad laminated board) by etching.

A three-layer printed wiring board was manufactured in the same manner as in the first example except that the thus prepared L1/L2 high-frequency substrate and L3 high-frequency substrate were used instead of the L1/L2 high-frequency substrate and the L3 high-frequency substrate of the first example.

Example 5

A three-layer printed wiring board was manufactured in the same manner as in Example 1 except that as a polyolefin resin sheet, a polyolefin resin sheet (one sheet) having a thickness of 25 μm and having the resin composition shown in (12) of Table 7 was used instead of the polyolefin resin sheet of Example 1.

Comparative Example 1

A three-layer printed wiring board was manufactured in the same manner as in Example 2 except that as an adhesive sheet, glass cloth reinforced polyphenylene ether resin prepreg (prepreg reinforced by glass cloth and containing a polyphenylene ether resin) having a thickness of 100 μm was used.

Examples 1 to 5 and Comparative Example 1 were subjected to the following evaluations.

(Transmission Loss)

Transmission loss in the signal layer of L2 at 5 GHz was measured for the three-layer printed wiring board of each of the examples and the comparative example. The results are shown in Tables 1 to 6.

(Thermal Resistance)

For the three-layer printed wiring board, a copper pattern of a 25 mm square was formed in L1, and heat resistance (JIS C 5012 10.4.1) was measured in solder float at a normal condition (less than or equal to 30° C., less than or equal to 60% Rh) and at a moisten condition (60° C., 60% Rh, 120 H). The results are shown in Tables 1 to 6.

TABLE 1

| | | | Examples 1-(1) to 1-(11) |
|---|---|---|---|
| PCB Configuration | L1/L2 High-Frequency Substrate | L1 | Copper Foil (Thickness: 18 μm) |
| | | Insulating Layer | Fluororesin Reinforced by Glass Cloth (Thickness: 0.16 mm) |
| | | L2 | Copper Foil (Thickness: 18 μm) |
| | Adhesive Sheet | Insulating Layer | Polyolefin Resin Sheet* (one 25-μm sheet) *Polyolefin Resin Compositions (1) to (11) in Table 7 |
| | L3 High-Frequency Substrate | No Copper Foil | No Copper Foil |
| | | Insulating Layer | Fluororesin Reinforced by Glass Cloth (Thickness: 0.16 mm) |
| | | L3 | Copper Foil (Thickness: 18 μm) |
| Transmission Loss (5 GHz) | | | ○ Good |
| Heat Resistance (Normal Condition) (Solder Float 120 seconds) | | | Higher than or Equal to 260° C. ○ Good |
| Heat Resistance (Moisten Condition) (Solder Float 120 seconds) | | | Higher than or Equal to 260° C. ○ Good |

TABLE 2

| | | | Examples 2-(1) to 2-(11) |
|---|---|---|---|
| PCB Configuration | L1/L2 High-Frequency Substrate | L1 | Copper Foil (Thickness: 18 μm) |
| | | Insulating Layer | PPE Resin Reinforced by Glass Cloth (Thickness: 0.13 mm) |
| | | L2 | Copper Foil (Thickness: 18 μm) |
| | Adhesive Sheet | Insulating Layer | Polyolefin Resin Sheet* (One 25 μm Sheet) *Polyolefin Resin Compositions (1) to (11) in Table 7 |
| | L3 High-Frequency Substrate | No Copper Foil | No Copper Foil |
| | | Insulating Layer | PPE Resin Reinforced by Glass Cloth (Thickness: 0.13 mm) |
| | | L3 | Copper Foil (Thickness: 18 μm) |
| Transmission Loss (5 GHz) | | | ○ Good |
| Heat Resistance (Normal Condition) (Solder Float 120 seconds) | | | Higher than or Equal to 260° C. ○ Good |
| Heat Resistance (Moisten Condition) (Solder Float 120 seconds) | | | Higher than or Equal to 260° C. ○ Good |

TABLE 3

| | | | Examples 3-(1) to 3-(11) |
|---|---|---|---|
| PCB Configuration | L1/L2 High-Frequency Substrate | L1 | Copper Foil (Thickness: 12 μm) |
| | | Insulating Layer | PAI Resin (Thickness: 10 μm) |
| | | L2 | Copper Foil (Thickness: 12 μm) |
| | Adhesive Sheet | Insulating Layer | Polyolefin Resin Sheet* (One 25 μm Sheet) *Polyolefin Resin Compositions (1) to (11) in Table 7 |
| | L3 High-Frequency Substrate | No Copper Foil | No Copper Foil |
| | | Insulating Layer | PAI Resin (Thickness: 10 μm) |
| | | L3 | Copper Foil (Thickness: 12 μm) |
| Transmission Loss (5 GHz) | | | ○ Good |
| Heat Resistance (Normal Condition) (Solder Float 120 seconds) | | | Higher than or equal to 260° C. ○ Good |
| Heat Resistance (Moisten Condition) (Solder Float 120 seconds) | | | Higher than or Equal to 260° C. ○ Good |

TABLE 4

| | | | Examples 4-(1) to 4-(11) |
|---|---|---|---|
| PCB Configuration | L1/L2 High-Frequency Substrate | L1 | Copper Foil (Thickness: 12 μm) |
| | | Insulating Layer | PI Resin Film (Thickness: 0.05 mm) |
| | | L2 | Copper Foil (Thickness: 12 μm) |
| | Adhesive Sheet | Insulating Layer | Polyolefin Resin Sheet* (One 25 μm Sheet) *Polyolefin Resin Compositions (1) to (11) in Table 7 |
| | L3 High-Frequency Substrate | No Copper Foil | No Copper Foil |
| | | Insulating Layer | PI Resin Film (Thickness: 0.05 mm) |
| | | L3 | Copper Foil (Thickness: 12 μm) |
| Transmission Loss (5 GHz) | | | ○ Good |
| Heat Resistance (Normal Condition) (Solder Float 120 seconds) | | | Higher than or Equal to 260° C. ○ Good |
| Heat Resistance (Moisten Condition) (Solder Float 120 seconds) | | | Higher than or Equal to 260° C. ○ Good |

TABLE 5

| | | | Example 5 |
|---|---|---|---|
| PCB Configuration | L1/L2 High-Frequency Substrate | L1 | Copper Foil (Thickness: 18 μm) |
| | | Insulating Layer | Fluororesin Reinforced By Glass Cloth (Thickness: 0.16 mm) |
| | | L2 | Copper Foil (Thickness: 18 μm) |
| | Adhesive Sheet | Insulating Layer | Polyolefin Resin Sheet* (One 25 μm Sheet) *Polyolefin Resin Composition (12) in Table 7 |
| | L3 High-Frequency Substrate | No Copper Foil | No Copper Foil |
| | | Insulating Layer | Fluororesin Reinforced By Glass Cloth (Thickness: 0.16 mm) |
| | | L3 | Copper Foil (Thickness: 18 μm) |
| Transmission Loss (5 GHz) | | | ○ Good |
| Heat Resistance (Normal Condition) (Solder Float 120 seconds) | | | Higher than or Equal to 260° C. ○ Good |
| Heat Resistance (Moisten Condition) (Solder Float 120 seconds) | | | Lower than or Equal to 260° C. Δ Slightly Good |

TABLE 6

|  |  |  | Comparative Example 1 |
|---|---|---|---|
| PCB Configuration | High-Frequency Substrate | L1/L2 L1 | Copper Foil (Thickness: 18 μm) |
|  |  | Insulating Layer | PPE Resin Reinforced by Glass Cloth (Thickness: 0.13 mm) |
|  |  | L2 | Copper Foil (Thickness: 18 μm) |
|  | Adhesive Sheet | Insulating Layer | PPE Resin Prepreg Reinforced by Glass Cloth (Thickness: 100 μm) |
|  | L3 High-Frequency Substrate | No Copper Foil | No Copper Foil |
|  |  | Insulating Layer | PPE Resin Reinforced by Glass Cloth (Thickness: 0.13 mm) |
|  |  | L3 | Copper Foil (Thickness: 18 μm) |
| Transmission Loss (5 GHz) |  |  | x Bad |
| Heat Resistance (Normal Condition) (Solder Float 120 seconds) |  |  | Higher than or equal to 260° C. ○ Good |
| Heat Resistance (Moisten Condition) (Solder Float 120 seconds) |  |  | Higher than or equal to 260° C. ○ Good |

TABLE 7

Composition Table of Polyolefin Resin Composition for Forming Polyolefin Resin Sheets Used in Examples 1 to 5 (unit: parts by mass)

| Polyolefin Resin Composition |  |  | (1) | (2) | (3) | (4) | (5) | (6) | (7) | (8) | (9) | (10) | (11) | (12) |
|---|---|---|---|---|---|---|---|---|---|---|---|---|---|---|
| Component (A) | 1 | SEPS | 100 | — | — | — | — | — | — | 50 | 100 | 50 | 150 | 100 |
|  | 2 | SEEPS | — | 100 | — | — | — | — | — | 50 | — | — | — | — |
|  | 3 | SEBS | — | — | 100 | — | — | — | — | — | — | — | — | — |
|  | 4 | SIS | — | — | — | 100 | — | — | — | — | — | — | — | — |
|  | 5 | Hydrogenated SIBS | — | — | — | — | 100 | — | — | — | — | — | — | — |
|  | 6 | SBBS | — | — | — | — | — | 100 | — | — | — | — | — | — |
|  | 7 | E-GMA-MA | — | — | — | — | — | — | 100 | — | — | — | — | — |
| Component (B) | 1 | Epoxy | 30 | 20 | — | — | — | — | — | — | — | — | — | — |
|  | 2 | Phenol 1 | — | 10 | — | — | — | — | — | — | — | — | — | — |
|  | 3 | Phenol 2 | — | — | 20 | — | 5 | — | — | — | — | — | — | — |
|  | 4 | Phenol 3 | — | — | — | 5 | — | — | — | — | — | — | — | — |
|  | 5 | BMI 1 | — | — | — | 25 | 10 | — | — | — | — | — | — | — |
|  | 6 | BMI 2 | — | — | — | — | — | 10 | 10 | 10 | 10 | 10 | 10 | — |
|  | 7 | OPE-Vn | — | — | — | — | 15 | 20 | 20 | 20 | 20 | 20 | 20 | 150 |
| Component (C) | 1 | Curing Accelerator | 0.3 | 0.1 | — | — | — | — | — | — | — | — | — | — |
| Component (D) | 1 | Silica | — | — | — | — | — | — | — | 10 | — | — | — | — |

TABLE 8

Manufacturers, Product Names, etc. of Components Included in Polyolefin Resin Compositions Used in Examples 1 to 5

| Polyolefin Resin Composition |  |  | Manufacturer | Product Name |
|---|---|---|---|---|
| Component (A) | 1 | SEPS | Kuraray Co., Ltd. | SEPTON 2007 |
|  | 2 | SEEPS | Kuraray Co., Ltd. | SEPTON 4055 |
|  | 3 | SEBS | Asahi Kasei Corp. | Tuftec H1221 |
|  | 4 | SIS | Zeon Corporation | Quintac 3450 |
|  | 5 | hydrogenated SIBS | Kuraray Co., Ltd. | HYBRAR 7311 |
|  | 6 | SBBS | Asahi Kasei Corp. | Tuftec P1500 |
|  | 7 | E-GMA-MA | Sumitomo Chemical Co., Ltd. | BONDFAST 7M |
| Component (B) | 1 | Epoxy | DIC Corporation | EPICLON HP7200 |
|  | 2 | Phenol 1 | Showa Denko K.K. | Shonol CKM2400 |
|  | 3 | Phenol 2 | Showa Denko K.K. | Shonol CKM908 |
|  | 4 | Phenol 3 | Gunei Chemical Industry Co., Ltd. | RESITOP PS-2655 |
|  | 5 | BMI 1 | K.I Chemical Industry Co., Ltd. | BMI-70 |
|  | 6 | BMI 2 | K.I Chemical Industry Co., Ltd. | BMI-80 |
|  | 7 | OPE-Vn | MITSUBISHI GAS CHEMICAL COMPANY, INC. | OPE-2St-2200 |
| Component (C) | 1 | Curing Accelerator | Reagent | 2-ethyl-4-methylimidazole |
| Component (D) | 1 | Silica | NIPPON AEROSIL CO., LTD. | AEROSIL 200 |

In each of Examples 1 to 4, the evaluations of the transmission loss and the thermal resistance led to the same results for all eleven examples of adhesive sheets (polyolefin resin sheets).

As shown in Tables 1 to 6, each example exhibited smaller transmission loss and better high frequency property than Comparative Example 1. These results were obtained probably because Comparative Example 1 adopted polyphenylene ether resin prepreg reinforced by glass cloth and having a higher value of the relative permittivity than the polyolefin resin sheet.

Moreover, Examples 1 to 4 each had better solder thermal resistance in the moisten condition than Example 5. The result was obtained probably because the percentage of the component (A) representing the polyolefin-based elastomer is larger in each of Examples 1 to 4 than in Example 5.

REFERENCE SIGNS LIST

1 Conductive Layer
2 Insulating Layer
3 Polyolefin Resin Layer
5 Metal Layer
10 Multilayer Printed Wiring Board
11 First Conductive Layer
12 Second Conductive Layer
20 Multilayer Metal clad laminated board 21 First Surface
22 Second Surface
40 Non-Polyolefin Resin Layer
201 First Insulating Layer
202 Second Insulating Layer

The invention claimed is:

1. A multilayer printed wiring board, comprising:
   conductive layers; and
   insulating layers,
   the conductive layers and the insulating layers being alternately stacked,
   each of the insulating layers including one or more of a polyolefin resin layer, a fluororesin layer, a polyphenylene ether resin layer, a polyamideimide resin layer, and a polyimide resin layer,
   at least one of the insulating layers including a polyolefin resin layer, the polyolefin resin layer containing:
   a component (A) representing a polyolefin-based elastomer and
   a component (B) representing a thermosetting resin, and
   the component (A) having a concentration from 50 wt. % to 95 wt. % in an entirety of the polyolefin resin layer,
   the component (A) is one or more selected from a group consisting of polystyrene-poly (ethylene/propylene) block-polystyrene copolymer, polystyrene-poly (ethylene-ethylene/propylene) block-polystyrene copolymer, polystyrene-poly (ethylene/butylene) block-polystyrene copolymer, polystyrene-polyisoprene block copolymer, hydrogenated polystyrene-polyisoprene-polybutadiene block copolymer, polystyrene-poly (butadiene/butylene) block-polystyrene copolymer, ethylene-glycidyl methacrylate copolymer, ethylene-glycidyl methacrylate-methyl acrylate copolymer, and ethylene-glycidyl methacrylate-vinyl acetate copolymer.

2. The multilayer printed wiring board according to claim 1, wherein
   two insulating layers serve as the insulating layers,
   the conductive layers are stacked alternately with the two insulating layers,
   one insulating layer of the two insulating layers includes one or more selected from a group consisting of a fluororesin layer, a polyphenylene ether resin layer, a polyamideimide resin layer, and a polyimide resin layer, and
   the other of the two insulating layers includes a polyolefin resin layer.

3. The multilayer printed wiring board according to claim 1, wherein
   the component (B) contains one or more components selected from a group consisting of an epoxy resin, a phenol resin, a bismaleimide resin, and a polyphenylene ether oligomer having vinyl groups at both ends.

4. The multilayer printed wiring board according to claim 1, wherein
   the polyolefin resin layer further contains a component (C) representing a curing accelerator.

5. The multilayer printed wiring board according to claim 1, wherein
   the polyolefin resin layer further contains a component (D) representing filler.

6. The multilayer printed wiring board according to claim 1, wherein
   the polyolefin resin layer after a process at 180° C. for 60 minutes has a storage elastic modulus within a range of $10^5$ Pa to $10^8$ Pa at a temperature ranging from 25° C. to 150° C.

* * * * *